United States Patent [19]

Yamazaki et al.

[11] Patent Number: 5,044,543

[45] Date of Patent: Sep. 3, 1991

[54] WIRE BONDING METHOD AND APPARATUS

[75] Inventors: Mikiya Yamazaki; Hiroshi Ushiki, both of Tokyo, Japan

[73] Assignee: Kabushiki Kaisha Shinkawa, Tokyo, Japan

[21] Appl. No.: 485,266

[22] Filed: Feb. 26, 1990

[30] Foreign Application Priority Data

Feb. 27, 1989 [JP] Japan .................................. 1-47597

[51] Int. Cl.⁵ ......................................... H01L 21/607
[52] U.S. Cl. ..................................... 228/110; 228/1.1; 228/4.5
[58] Field of Search ...................... 228/1.1, 102, 8, 4.5

[56] References Cited

U.S. PATENT DOCUMENTS

| | | | |
|---|---|---|---|
| 3,158,928 | 12/1964 | Prisco et al. | 228/102 |
| 3,727,822 | 4/1973 | Umbaugh | 228/1.1 |
| 4,313,778 | 2/1982 | Mims | 228/1.1 X |
| 4,877,173 | 10/1989 | Fujimoto et al. | 228/1.1 |

Primary Examiner—Kenneth J. Ramsey

Attorney, Agent, or Firm—Koda and Androlia

[57] ABSTRACT

A wire bonding apparatus including a horn with a bonding tool at one end and a vibrator at the other end, an automatic tracking type ultrasonic oscillating power supply which supplies power to the vibrator and tracks changes in the resonance frequency of the horn by feeding back the error voltage generated by changes in the resonance frequency of the vibrator, a bonding head supporting the horn so that the horn can move vertically and horizontally, an X-Y table which drives the bonding head in the X and Y directions, and an arithmetic unit which converts the error voltage of the ultrasonic oscillating power supply into a coordinate error and corrects the bonding coordinates. Using such a bonding apparatus, changes in the resonance frequency of the vibrator are converted into an amount of expansion or contraction of the horn, such an amount is calculated, and the bonding coordinates are corrected, so that an X-Y table is driven in accordance with these corrected bonding coordinates to bring the bonding tool to a correct bonding point.

2 Claims, 1 Drawing Sheet

WIRE BONDING METHOD AND APPARATUS

BACKGROUND OF THE INVENTION

1. Field of the Invention

The present invention relates to a wire bonding method and apparatus for the same.

2. Prior Art

Heat and pressure as well as ultrasound are used for wire bonding. Today, however, ultrasound is almost always coused in the case of bonding by heat and pressure. In both cases, therefore, the bonding arm is made up with an ultrasonic vibrator and horn.

In the ultrasonic wire bonding method, as is well known, a bonding tool through which a wire is passed is brought to a first bonding point (e.g. a pad on a pellet) and a second bonding points (e.g. the lead post on a lead), so that the wire is connected to the first and second bonding points.

A heating block which heats semiconductor components that are to be bonded is installed beneath the bonding position. As a result, the horn which holds the bonding tool at one end is heated by radiant heat, resulting in that the horn elongates due to thermal expansion. Furthermore, since heat is generated when voltage is applied to the vibrator, the horn is heated also by this heat.

When the horn elongates, the bonding tool is not brought to predetermined bonding coordinates; a discrepancy occurs in the bonding position. For example, when the temperature rises from 20° C. to 70° C., the horn elongates by approximately 30 microns.

In conventional systems, the horn is cooled by air which is constantly blowing onto the horn so that the temperature rise of the horn is inhibited.

In the prior art as described above, the horn is cooled by air. However, since the difference between the temperature at the time the bonding work starts and the saturation temperature during the bonding operation is not reduced, repositioning must be performed when the saturation temperature is reached.

SUMMARY OF THE INVENTION

Accordingly, the object of the present invention is to provide a wire bonding method and apparatus in which repositioning of the bonding tool for bonding positions is not necessary even when the horn reaches the saturation temperature.

Such an object is accomplished by a wire bonding method of the present invention which uses an apparatus including (a) a bonding tool through which a wire is passed, (b) a horn which holds the bonding tool at one end, (c) a vibrator fastened to the horn, (d) a bonding head which supports the horn so that the horn moves up and down and rotates horizontally, and (e) an X-Y table which drives the bonding head in the X and Y directions. In the apparatus thus constructed, (1) changes in the resonance frequency of the vibrator are converted into an expansion or contraction of the horn, (2) the amount of this expansion or contraction is calculated to correct the bonding coordinates, and (3) the X-Y table is driven in accordance with these corrected bonding coordinates so that the bonding tool is brought to the correct bonding point.

Furthermore, the object of the present invention is accomplished by an apparatus which includes: (a) the bonding tool through which a wire is passed, (b) a horn which holds the bonding tool at one end, (c) a vibrator which is fastened to the horn, (d) an automatic tracking type ultrasonic oscillating power supply which supplies power to the vibrator and tracks changes in the resonance frequency of the horn by feeding back the error voltage generated by changes in the resonance frequency of the vibrator, (e) a bonding head which supports the horn so that the horn moves up and down and rotates, (f) an X-Y table which drives the bonding head in the X and Y directions, and (g) an arithmetic unit which converts the error voltage of the automatic tracking type ultrasonic oscillating power supply into a coordinate error and corrects the bonding coordinates. The X-Y table is driven according to the bonding coordinates corrected by the arithmetic unit so that the bonding tool is moved to the correct bonding point.

In the wire bonding method and apparatus, changes in the temperature of the horn are captured as changes in the resonance frequency of ultrasonic waves. These changes in resonance frequency are converted into an expansion or contraction of the horn, and the bonding coordinates are corrected by virtue of this expansion or contraction. As a result, the tool is always brought to the correct bonding position so that improper bonding is prevented, improving the yield.

DETAILED DESCRIPTION OF THE INVENTION

Figure 1:
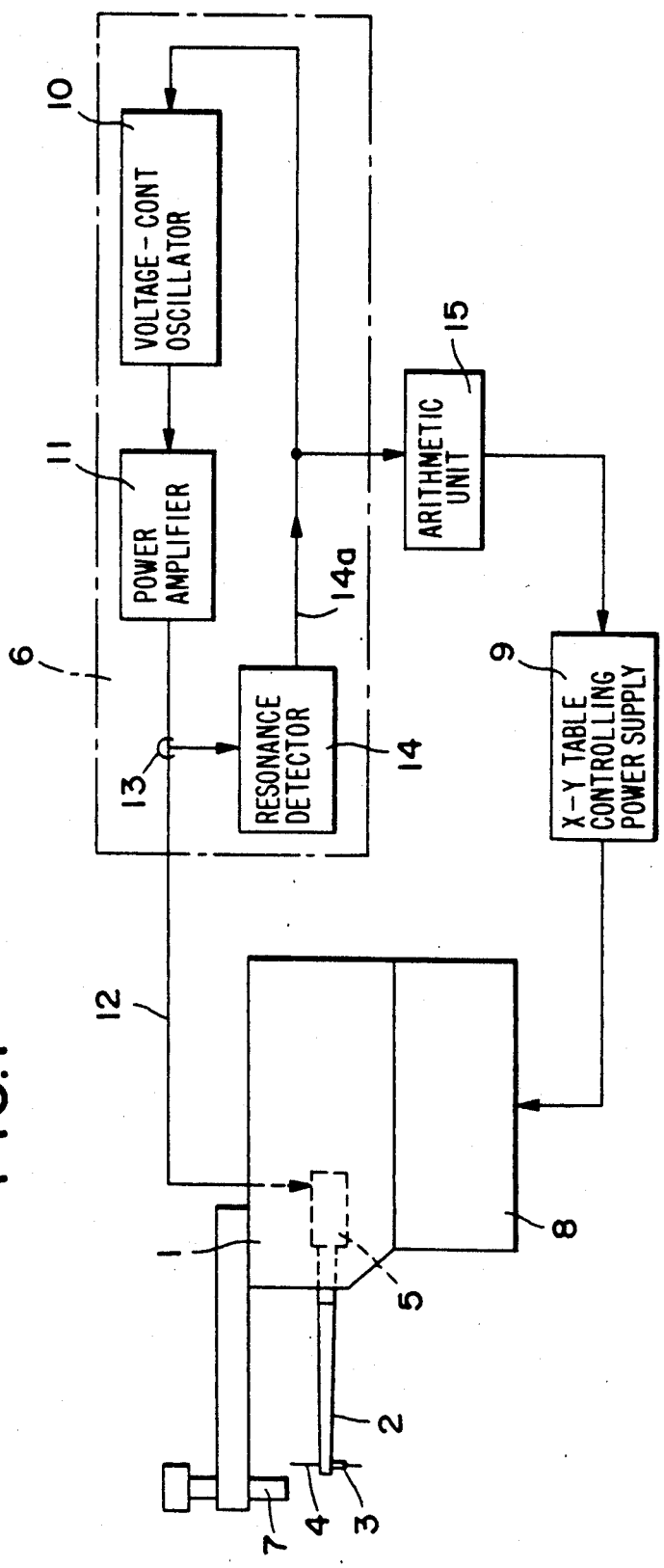
FIG. 1 is a block diagram which illustrates the structure of the device of the present invention.

In FIG. 1, a horn 2 is mounted on a bonding head 1 so that the horn 2 is free to move up and down and rotate horizontally by a driving means (not shown).

A bonding tool 3 is fastened to the front end of the horn 2, and a wire 4 is passed through this bonding tool 3. A vibrator 5 attached to the other end of the horn 2 is caused to oscillate by an automatic tracking type ultrasonic oscillating power supply 6.

A camera 7 which detects the bonding point is mounted to the bonding head 1 which is mounted on an X-Y table 8. The table 8 is driven in the X and Y directions via an X-Y table controlling power supply 9.

The automatic tracking type ultrasonic oscillating power supply (called "power supply") 6 includes a voltage-controlled variable-frequency oscillator (called "oscillator") 10. Power from this oscillator 10 is supplied to the vibrator 5 via power amplifier 11.

A resonance detector 14 is connected via an universally known PLL (Phase Locked Loop) circuit 13 to the feeder line 12 which runs from the power amplifier 11 to the vibrator 5. Error voltage 14a of the resonance detector 14 is fed back to the oscillator 10. Furthermore, the error voltage 14a is fed into an arithmetic unit 15 which stores the bonding coordinates by which the bonding tool 3 is moved. This error voltage 14a is converted into a coordinate error by the arithmetic unit 15 so that the bonding coordinates are corrected.

Various tests indicate that the resonance frequency of the vibrator 5 shifts as the horn 2 elongates as a result of a rise in temperature. In other words, the resonance frequency drops more or less in proportion to the amount of elongation of the horn 2.

The X-Y table 8 is driven by the X-Y table controlling power supply 9 in accordance with data signals representing the bonding coordinates stored in the arithmetic unit 15, so that the bonding tool 3 is moved or brought to the correct bonding point. The horn 2 is vertically driven by a vertical driving means (not shown), and power is supplied to the vibrator 5 from the voltage-controlled variable-frequency oscillator 10, so that the wire 4 is connected to the first bonding point and second bonding point.

Figure 2:
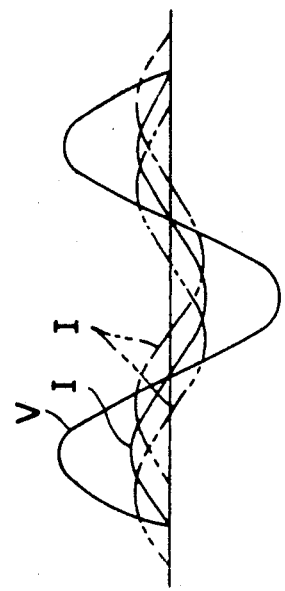
FIG. 2 is an explanatory graph which illustrates the relationship between voltage and current.

In the wire bonding operation described above, when the temperature of the horn 2 rises and the horn 2 elongates, the resonance frequency of the vibrator 5 tends to shift or unstable. When this occurs, the curve representing current I vs. voltage V shifts as indicated by the two-dot chain line or one-dot chain line as shown in FIG. 2. The voltage V and current I are extracted by the PLL circuit 13, and the phase shift of the voltage V and current I are detected by the resonance detector 14, and then the error voltage 14a is output. This error voltage 14a is fed back to the oscillator 10. The oscillator 10 thus tracks the changes in the resonance frequency of the horn 2 and outputs power so that the resonance frequency of the horn 2 is maintained at a constant value.

When the error voltage 14a is input into the arithmetic unit 15, the arithmetic unit 15 converts the error voltage 14a into a coordinate error, and the bonding coordinates stored beforehand in the arithmetic unit 15 are corrected.

Assuming that the axial direction of the horn 2 is the Y direction, the Y coordinate error corresponding to the error voltage 14a is calculated in the arithmetic unit 15, and the Y coordinate of the movement coordinates of the bonding tool 3 (i.e., the bonding coordinates) is corrected. The X-Y table 8 is driven in the X and Y directions by the X-Y table controlling power supply 9 in accordance with this corrected coordinate, so that the bonding tool 3 is brought to above the bonding point. Afterward, the wire bonding is performed by the same operation as in conventional manner.

As is clear from the above description, the amount of the elongation [or "expansion or contraction"] of the horn 2 is automatically compensated for even when the horn elongates as a result of a rise in temperature. Accordingly, there is no need for repositioning. Since the tool is always brought to the correct bonding position, faulty wire bonding is eliminated so that the yield is improved.

We claim:

1. A wire bonding method used in a wire bonding apparatus which comprises a bonding tool through which a wire is passed, a horn which holds said bonding tool at one end, a vibrator fastened to said horn, a bonding head which supports said horn so that said horn is free to move upward and downward and to rotate, and an X-Y table which drives said bonding head in the X and Y directions, wherein said method comprises the steps of:

converting the changes in the resonance frequency of said vibrator into an expansion or contraction of said horn;

correcting the bonding coordinate by calculating the amount of said expansion or contraction; and driving said X-Y table in accordance with said corrected bonding coordinates so that said bonding tool is brought to a correct bonding point.

2. A wire bonding apparatus characterized in that said apparatus comprises:

a bonding tool through which a wire is passed;

a horn which holds said bonding tool at one end;

a vibrator fastened to said horn;

an automatic tracking type ultrasonic oscillating power supply connected to said vibrator, said oscillating power supply supplying power to said vibrator and tracks changes in the resonance frequency of said horn by feeding back the error voltage generated by changes in the resonance frequency of said vibrator;

a bonding head which supports said horn so that said horn moves upward and downward and rotates;

an X-Y table which drives said bonding head in the X and Y directions, and an arithmetic unit connected to said oscillating power supply, said arithmetic unit converting the error voltage of said automatic tracking type ultrasonic oscillating power supply into a coordinate error and correcting the bonding coordinates, wherein said X-Y table is driven pursuant to the bonding coordinates corrected by said arithmetic unit so that said bonding tool is moved to a correct bonding point.

* * * * *